(12) United States Patent
Gwo

(10) Patent No.: US 7,151,284 B2
(45) Date of Patent: Dec. 19, 2006

(54) STRUCTURES FOR LIGHT EMITTING DEVICES WITH INTEGRATED MULTILAYER MIRRORS

(76) Inventor: Shangjr Gwo, 6F-1, No. 1, Lane 175, Wulin Road, Hsinchu City 300 (TW)

( * ) Notice: Subject to any disclaimer, the term of this patent is extended or adjusted under 35 U.S.C. 154(b) by 296 days.

(21) Appl. No.: 10/843,518

(22) Filed: May 11, 2004

(65) Prior Publication Data

US 2005/0100069 A1 May 12, 2005

Related U.S. Application Data

(63) Continuation-in-part of application No. 10/714,649, filed on Nov. 18, 2003, now Pat. No. 7,012,016.

(60) Provisional application No. 60/519,064, filed on Nov. 10, 2003, provisional application No. 60/530,331, filed on Dec. 17, 2003.

(51) Int. Cl.
*H01L 29/24* (2006.01)

(52) U.S. Cl. .................. 257/103; 257/79; 257/E33.001
(58) Field of Classification Search ................. 257/103
See application file for complete search history.

(56) References Cited

U.S. PATENT DOCUMENTS

| | | | | |
|---|---|---|---|---|
| 3,421,936 A | * | 1/1969 | Vogel, Jr. | ................... 428/448 |
| 5,835,521 A | * | 11/1998 | Ramdani et al. | ............... 372/96 |
| 2002/0030198 A1 | * | 3/2002 | Coman et al. | ............... 257/103 |
| 2004/0224459 A1 | * | 11/2004 | Nishikawa | ................... 438/202 |

* cited by examiner

*Primary Examiner*—B. William Baumeister
*Assistant Examiner*—Matthew L Reames
(74) *Attorney, Agent, or Firm*—Rodney T Hodgson

(57) ABSTRACT

A substrate for supporting epitaxial growth of light emitting semiconductor devices having a non-crystalline multilayer reflection controlling stack under a thin layer of single crystal silicon is shown. A III-Nitride or other semiconductor stimulated emission device is grown on the thin layer of silicon.

14 Claims, 2 Drawing Sheets

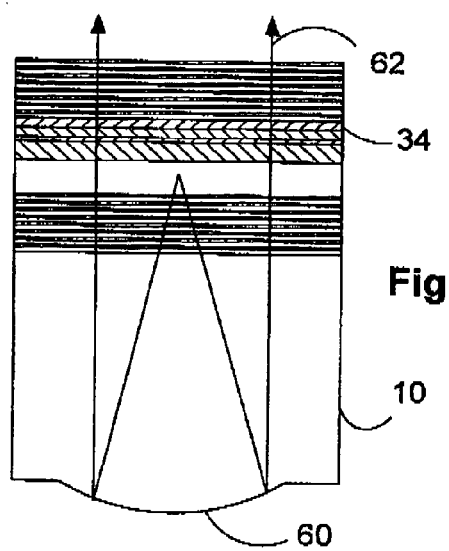
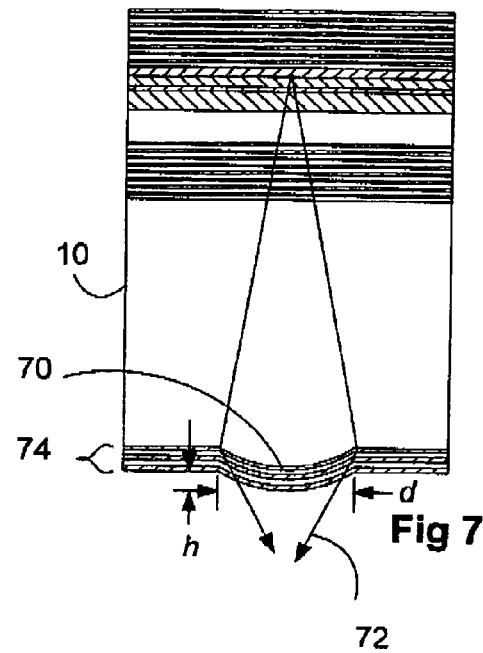
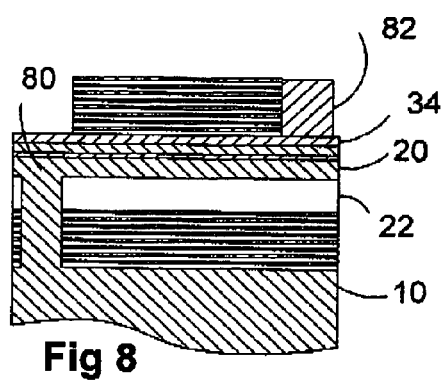
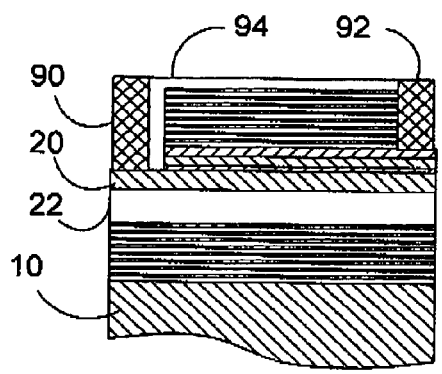
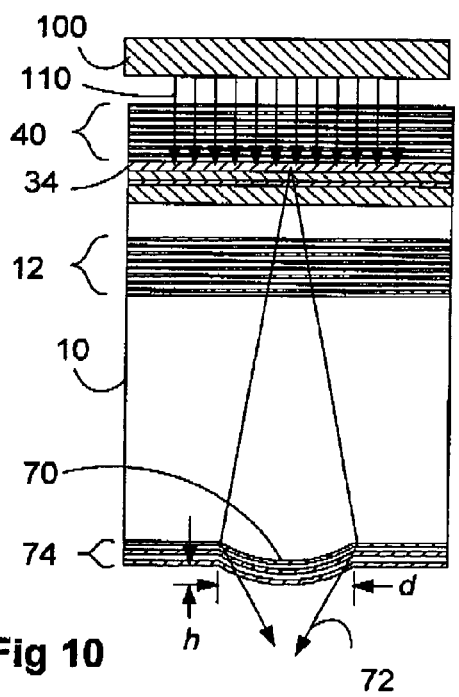

STRUCTURES FOR LIGHT EMITTING DEVICES WITH INTEGRATED MULTILAYER MIRRORS

CROSS REFERENCE TO RELATED APPLICATIONS

This application claims priority to copending U.S. application Ser. No. 10/714,649 filed Nov. 18, 2003 by Shangjr Gwo, and claims priority pursuant to 35 U.S.C. 119(e) to the following U.S. Provisional Applications: Application No. 60/519,064 filed Nov. 10, 2003 and Application No. 60/530,331 filed Dec. 17, 2003, all of the above applications being incorporated herein by reference in their entirety including incorporated material.

OBJECTS OF THE INVENTION

It is an object of the invention to produce light emitting group III-nitride (III-N) or other light emitting semiconductor devices constructed on a multilayer dielectric reflecting stack on a substrate, where the substrate has a thin layer of single crystal silicon interposed between the non-crystalline reflecting stack and the devices.

SUMMARY OF THE INVENTION

A multilayer reflector (distributed Bragg reflector or DBR) is constructed on a substrate. A single crystal silicon wafer is bonded to the DBR, and most of the silicon wafer is removed to leave a thin layer of single crystal silicon attached to the DBR. A III-N or other III-V light emitting device is constructed in epitaxial relation to the single crystal silicon layer. A second DBR is optionally constructed on top of the light emitting device, and electrical contacts are made to the n and p type layers of the light emitting device through the top DBR or through the top DBR and through the bottom DBR to the substrate.

BRIEF DESCRIPTION OF THE DRAWINGS

FIG. 6 shows an embodiment of the invention.

FIG. 7 shows an embodiment of the invention.

FIG. 8 shows an embodiment of electrical connections of the invention.

FIG. 9 shows an embodiment of electrical connections of the invention.

FIG. 10 shows a preferred embodiment of the invention without electrical contacts.

DETAILED DESCRIPTION OF THE INVENTION

Figure 1:
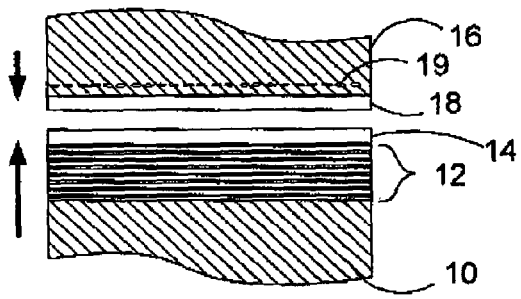
FIG. 1 shows a sketch of the construction of the apparatus of the invention.

FIG. 1 shows a sketch of the construction of the apparatus of the invention. A thick substrate 10 has a number of layers of alternating index of refraction material deposited to form a multilayer controlled reflectivity stack 12. The substrate 10 is preferably a silicon wafer, but may be made of any other material such as quartz, GaAs or other semiconductor, chalcogenide glasses, or even a metal, dependent on the light transmission and/or thermal expansion coefficients required. The multilayer stack is constructed by techniques very well known in the art of dielectric mirrors, anti-reflection coatings, and dichroic mirrors. The thicknesses of the layers of the multilayer stack are determined preferably so that light of wavelength $\lambda$ incident normally on the substrate 10 is reflected with a high reflection coefficient, and the multilayer stack is called a distributed Bragg reflector (DBR). For example, light of wavelength $\lambda$ of 1.3 or 1.55 micron wavelength will be transmitted with little loss through the preferred low index silicon dioxide and higher index silicon or zirconium dioxide materials of alternating layers. The index difference between the silicon and the silicon dioxide is quite large, and a few pairs of layers of $\lambda/4$ optical thickness is sufficient to give very high reflectivity. Layers of optical thickness $\lambda/2$ would be used for a minimum reflectivity stack, and other combinations as known in the art will give dichroic mirrors. Other materials as known in the art could be used as well for the DBR. In particular, amorphous silicon, poly silicon, GaN, GaAs, or any high index of refraction material such as titanium dioxide or zirconium dioxide which is transparent to light of wavelength $\lambda$ may be used along with other low index materials such as oxides and calcium and strontium fluorides, bromides, etc. and chalcogenide glasses. In contrast, DBR's formed from alternating layers of single crystalline epitaxial grown materials such as (AlGa)As/GaAs, (GaIn)(AsP)/InP based materials require a few tens of pairs of layers to give high reflectivity since the index of refraction change between one semiconductor material and another is small. Therefore, the fabrication of semiconductor epitaxial DBRs with large numbers of layers is very difficult due to the lattice mismatch between two comprising materials. Also, the stop band of DBRs via epitaxial grown semiconductor materials of low refractive index contrast is quite narrow and the effective cavity length is much longer as the light penetration depth in the mirror increases as the refractive index contrast decreases. On the other hand, the dielectric DBR has a wide stop band and a short light penetration depth due to a large refractive index contrast. An optional layer of material 14 is shown on top of the DBR 12. The preferred material 14 is silicon dioxide. Note that none of the layers of the DBR 12 nor the layer 14 need be single crystalline or need be electrically conducting, in contrast to many DBR's for use adjacent semiconductor vertical cavity surface emitting lasers (VCSELS) which are known in the prior art. However, in particular cases, the layers of DBR 12 and layer 14 may be electrically conductive as required for devices grown on top of DBR 12 and optional layer 14.

Figure 2:
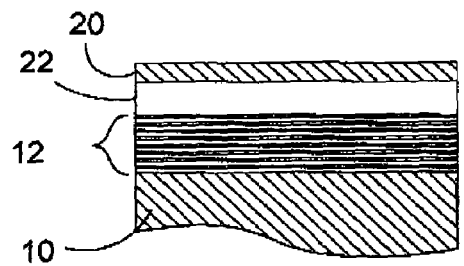
FIG. 2 shows the apparatus at a further stage of construction.

FIG. 1 shows a silicon or other semiconductor wafer or substrate 16 having an optional layer 18, preferably an $SiO_2$ layer, on its surface being brought into contact with the substrate IO. The book entitled "Semiconductor Wafer Bonding" by Q.-Y. Tong and U. Gösele (Wiley, 1999) shows in great detail that two substrates may be bonded together when the substrates have clean flat surfaces to form the structure of FIG. 2. Various methods of removing most of the silicon wafer 16 after bonding are known in the art: eg. etching, grinding and polishing most of wafer 16 away, etching wafer 16 down to an etch stop layer (not shown), or implanting hydrogen to form a layer of defects 19 and splitting the bonded substrates 10 and 16 apart along the line of defects 19. FIG. 2 shows the apparatus when the resulting apparatus has a thin layer of polished single crystal semiconductor material 20, preferably single crystal silicon with a <1 1 1>orientation, on top of the optional material layer 22 formed by the combined layers 14 and 18. The thickness of the layers 14, 18 and 20 can be controlled with exquisite precision down to nanometer dimensions. For the purposes of this specification, a thin layer is defined as a layer which would not be thick enough to act as a support for a semiconductor device, while a thick layer would be thick enough to act as a support for a semiconductor device.

Figure 3:
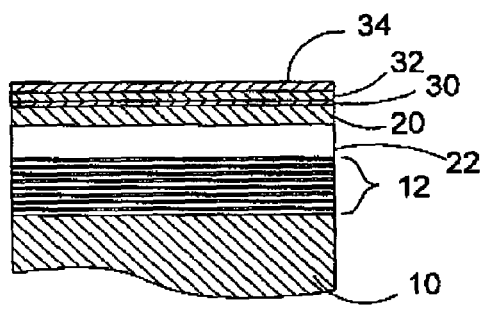
FIG. 3 shows a sketch of a preferred embodiment of the invention.

Material for III-V or III-N light emitting device is now grown in epitaxial relation to the single crystal semiconductor material 20. For the most preferred embodiment of a III-N device, shown in FIG. 3, an optional diffusion barrier layer 30 of epitaxially grown $Si_3N_4$, a layer 32 of epitaxially grown AlN, and a layer 34 of epitaxially grown III-N material are all grown in epitaxial relation to the single crystal semiconductor material of layer 20.

Layer 34 is preferably comprised of multiple layers, preferably including at least one quantum well, and will be described later.

Figure 4:
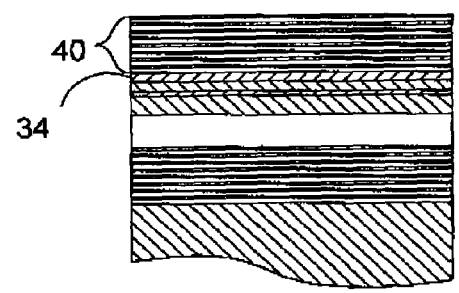
FIG. 4 shows a sketch of further construction of the invention.

FIG. 4 shows a second DBR 40 grown on top of the III-N material. The two DBR's 12 and 40 form an optical cavity to facilitate controlled light emission or stimulated emission in the preferred III-V or most preferred III-N device described below. The layers of the DBR's 12 and 40 are preferably precisely located with respect to one another, so that the proper position of the nodes and antinodes of a standing wave pattern are positioned correctly with respect to stacks 12 and 40 and with layer 34.

Figure 5:
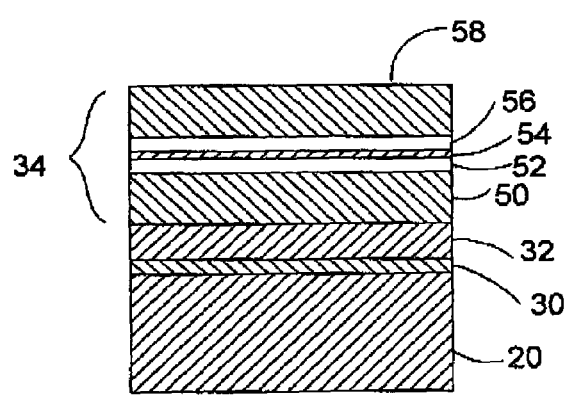
FIG. 5 shows the III-N device denoted layer 34 in more detail.

FIG. 5 shows the III-N device denoted layer 34 in more detail. Preferably, layer 50 is a spacer layer of GaN which is doped the same type as layers 20 and 32. Preferably, layer 20 is heavily doped n-type (1 1 1) silicon. Layer 52 is a preferably undoped $In_{1-y}Ga_yN$ barrier layer. Layer 54 is an high indium content $In_{1-x}Ga_xN$ active layer, preferably undoped, and layer 56 is a barrier layer of preferably undoped $In_{1-y}Ga_yN$, where y>x. Layer 58 is an optional spacer layer of GaN doped with the opposite type dopant as layer 50. Layers 52, 54, and 56 form a quantum well which confines carriers so that they recombine in layer 54 and emit light of wavelength λ determined by the indium composition of the $In_{1-x}Ga_xN$ of the layer 54. The optical thickness of layer 34 is preferably controlled so that the total optical thickness, including layers 20, 22, 30, 32, 34, is a multiple of half lambda. Layer 54 is preferably located at an antinode of the standing wave light pattern produced by DBR's 12 and 40. Layers 52, 54, and 56 are optionally repeated to form a multiquantum well (not shown). Layers 50 and 58 are preferably comprised of mostly GaN, but some substitution of Ga by In or Al in all or part of layers 50 and 58 may be preferred in different embodiments. Layers 52, 54, and 56 are preferably comprised of mostly InN, but some substitution of In by Ga or Al in all or part of layers 52, 54, and 56 may be preferred in different embodiments. In the same way, layers 50-58 are comprised mostly of nitrogen, but other group V elements such as and P may be substituted in small amounts for N in preferred embodiments of the invention.

The present specification defines III-N devices as devices comprising compound semiconductors formed from Ga, In, and Al, in combination with nitrogen, and allows small amounts of As or P to be substituted in place of the majority nitrogen material.

FIG. 6 shows a device whereby light of wavelength λ produced from a III-N device passes through the substrate 10 (which in this case is transparent to light of wavelength λ generated in the layer 54) to a curved surface 60 of the substrate 10, whereby it is used as a microlens to refract the emitted light to a tight spot. The curved surface 60 can be made as the surface of a monolithically integrated microlens using a substrate micromachining technique. For example, to fabricate a microlens array on the bottom surface of the substrate 10, the photo-resist reflow and dry etching method can be applied. In this method, a photoresist layer is spun onto the substrate and patterned by optical lithography into cylindrical posts. When subsequently baked, surface tension of the photoresist causes the cylindrical posts to change into truncated hemispherical shaped posts. The resulted resist is then used as a dry etch mask to transfer the resist shape into the substrate material and to form plano-convex microlens. The dry etching method can be reactive-ion etching (RIE), inductively coupled plasma (ICP) etching, and so on. The plano-convex microlens structure has a radius r (d=2r) and a height h. The sphere of which the microlens is a truncated part has a radius R. R can be deduced from the measured values of microlens radius r and height h using the relationship $R^2=(R-h)^2+r^2$ and $R=(h^2+r^2)/2h$. The focal length f of the plano-convex microlens can be determined by the following relationship $f=R/(n-1)$, where n is the refractive index of the substrate.

FIG. 7 shows an alternate apparatus for extracting light from the apparatus of the invention. Light 72 is refracted at the curved surface 70 of the substrate 10. An optional multilayer antireflection coating 74 is shown which prevents reflection and loss of light back into the substrate 10.

FIG. 8 shows an alternative embodiment of the invention where electrical contact to one side of the III-N device is made through a conducting substrate 10 by etching a via hole through the first DBR 12 and filling the via hole with a conductor 80, for example with doped polysilicon. A connection to the other side of the III-N device is made by etching a via hole from the top and filling it with an electrically conducting material 82. In an alternative embodiment of the invention, all the layers of substrate and the DBR to the layer 50 are sufficiently electrically conducting.

FIG. 9 shows the most preferred embodiment of the invention where electrical contact to one side of the III-N device is made by etching a via holes through the second DBR 12 and filling the via holes with conductors 90 and 92. Insulating material 94 may be used for insulation and to protect the device.

FIG. 10 shows a preferred embodiment of the invention where electrical contact does not have to be made to the light emitting device of layer 34. Instead, a laser or other light source 100 deposits light 110 of wavelength $\lambda_1$ into layer 34. The photon energy corresponding to wavelength $\lambda_1$ is larger than the photon energy emitted by layer 34. Thus, the process of photon energy down conversion is possible. As a result, the light of wavelength $\lambda_1$ 110 emitted by light source 100 excites the active regions in layer 34 to produce light of longer wavelength λ. In this embodiment, the controlled reflectivity stack 40 transmits light of wavelength $\lambda_1$ and reflects light of wavelength λ. The controlled reflectivity stack 12 reflects light of wavelength λ and preferably reflects light of wavelength $\lambda_1$. The substrate 10 preferably transmits light of wavelength λ and absorbs light of wavelength $\lambda_1$. The device shown in FIG. 10 is thus an efficient converter of light from a first wavelength $\lambda_1$ to a second, longer wavelength λ.

Experimental Results

In the prior art, no reports show how to grow high-In-content $In_{1-x}Ga_xN$ epitaxial layers on a silicon substrate with strong near-infrared luminescence at room temperature. Here, we describe how to grow a high-quality InN epitaxial layer on a Si(111) substrate, which is a transparent substrate for near-infrared light (the bandgap of silicon is ~1.1 eV).

In the experiment, Si (111) substrates were chemical etched before loading into a molecular-beam epitaxy (MBE) chamber, and thermally degassed in situ at high temperature to remove the remaining thin oxide layer. Silicon substrates prepared by this process showed a clear (7×7) surface reconstruction at high temperature, confirmed by the reflection high-energy electron diffraction (RHEED) pattern. In the growth procedure, a nitrogen ($N_2$) plasma source was used as the active nitrogen source. At first, the active nitrogen plasma was introduced to the Si (111) surface at high temperature (slightly above the (7×7) to (1×1) phase transition temperature of the Si(111) surface, ~875° C.) for 1 min to form a single-crystal $Si_3N_4$ layer. During this process, RHEED pattern changed to the (8×8) reconstruction (with respect to the Si lattice constant). Next, an epitaxial AlN buffer layer was grown at high temperature (900° C.). Then, the substrate was cooled down to low temperature. During the cooling down process, the AlN (3×3)-reconstructed surface appeared at temperature below ~600° C. Next, a low-temperature (LT) InN epitaxial layer was grown at a low temperature (<500° C.) while maintaining the streaky RHEED pattern. After the thin nucleation layer growth of LT-InN, the RHEED pattern became partially spotty. Then, the substrate was annealed to ~500° C. and the RHEED pattern became streaky again. Finally, a high-temperature (HT) InN epitaxial layer was grown at ~520° C. The RHEED pattern was always streaky during HT-InN growth. The film thickness determined by transmission electron microscopy (TEM) was 350 nm for the InN epilayer and 35 nm for the AlN buffer layer.

Growth of a (0001)-oriented single crystalline wurtzite-InN layer was confirmed by reflection high-energy electron diffraction, X-ray diffraction, and Raman scattering. At room temperature, these films exhibited strong near-infrared (0.6–0.9 eV) photoluminescence (PL). Note that 0.8 eV photoluminesnce roughly corresponds to the light wavelength of 1.55 micron.

In addition to the optical absorption measurement of absorption edge and direct band nature, the PL signal was found to depend linearly on the excitation laser intensity over a wide intensity range. These results indicate that the observed PL is due to the emission of direct band-to-band recombination rather than the band-to-defect (or impurity) deep emission. For the purpose of fabricating high-reflectivity and wide stop-band DBRs, quarter-wavelength stacks of alternating amorphous Si ($\alpha$-Si) and amorphous $SiO_2$ are very suitable since the refractive index difference is very large (3.54 versus 1.44). Thus, only a few pairs of $\alpha$-Si/$SiO_2$ can form a DBR of high reflectivity.

Obviously, many modifications and variations of the present invention are possible in light of the above teachings. It is therefore to be understood that, within the scope of the appended claims, the invention may be practiced otherwise than as specifically described.

I claim:
1. An apparatus, comprising;
    a III-N light emission device, comprising;
    a thick substrate, then;
    a first multilayer high reflectivity stack attached to the substrate, at least one layer of the first multilayer stack comprising a non-single-crystalline layer;
    a thin layer of single crystal silicon attached to the first multilayer high reflectivity stack, a thin layer of single crystal AlN attached in epitaxial relationship to the thin layer of single crystal silicon;
    a thin single crystal diffusion barrier attached in epitaxial relationship between the thin layer of single crystal silicon and the thin layer of AlN, where the diffusion barrier is $Si_3N_{:4}$;
    a thin III-N light emission device attached in epitaxial relationship to the single crystal layer of AlN; and
    a second multilayer high reflectivity stack attached above the thin III-N light emission device.

2. An apparatus, comprising in order from the bottom to the top of the apparatus:
    a thick substrate;
    a first multilayer controlled reflectivity stack attached to the substrate, at least one layer of the first multilayer stack comprising a non-single-crystalline layer;
    a thin layer of single crystal silicon attached to the first multilayer stack; and
    a thin single crystal diffusion barrier attached in epitaxial relationship to the thin layer of single crystal silicon, where the diffusion barrier is $Si_3N_4$.

3. The apparatus of claim 2, further comprising a layer of single crystalline direct bandgap semiconductor material attached to the thin single crystal diffusion barrier in epitaxial relationship with the thin single crystal diffusion barrier and the thin layer of single crystal silicon.

4. The apparatus of claim 3, wherein the direct bandgap semiconductor material comprises III-Nitride material.

5. The apparatus of claim 4, further comprising a thin layer of single crystal AlN material interposed between the thin layer of single crystal silicon and the thin single crystal diffusion barrier, wherein the thin layer of single crystal AlN material is in epitaxial relationship to the thin layer of single crystal silicon and the thin single crystal diffusion barrier.

6. The apparatus of claim 3, wherein the direct bandgap semiconductor material comprises III-V material.

7. An apparatus, comprising in order from the bottom to the top of the apparatus;
    a thick substrate, then;
    a first multilayer controlled reflectivity stack attached to the substrate, at least one layer of the first multilayer stack comprising a non-single-crystalline layer;
    a thin layer of single crystal silicon attached to the first multilayer controlled reflectivity stack;
    a thin single crystal diffusion barrier attached in enitaxial relationship to the thin lever of single crystal silicon, where the diffusion barrier is $Si_3N_4$; and
    a light emission device attached in epitaxial relationship to the a thin single crystal diffusion barrier and the single crystal layer of silicon.

8. The apparatus of claim 7, further comprising a second multilayer controlled reflectivity stack attached above the light emission device, wherein the light emission device is a stimulated light emission device.

9. The apparatus of claim 7, wherein two electrical contacts are made to the light emission device from the top of the apparatus.

10. The apparatus of claim 7, wherein at least one electrical contact is made from the substrate through the first multilayer controlled reflectivity stack to provide electrical contact to the light emission device.

11. The apparatus of claim 7, wherein the bottom side of the substrate has a lens shape opposite the light emission device.

12. The apparatus of claim 7, wherein the light emission device is a III-V light emission device.

13. The apparatus of claim 7, wherein the light emission device is a III-Nitride light emission device.

14. The apparatus of claim 13, further comprising a layer of single crystal AlN material interposed between the a thin single crystal diffusion barrier and the and the III-Nitride light emission device.

* * * * *